United States Patent
Murphy et al.

(10) Patent No.: US 11,682,559 B2
(45) Date of Patent: Jun. 20, 2023

(54) METHOD TO FORM NARROW SLOT CONTACTS

(71) Applicant: Tokyo Electron Limited, Tokyo (JP)

(72) Inventors: Michael Murphy, Albany, NY (US); Jodi Grzeskowiak, Albany, NY (US); Anton J. deVilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/221,416

(22) Filed: Apr. 2, 2021

(65) Prior Publication Data

US 2021/0391180 A1 Dec. 16, 2021

Related U.S. Application Data

(60) Provisional application No. 63/037,798, filed on Jun. 11, 2020.

(51) Int. Cl.
| | | |
|---|---|---|
| H01L 21/308 | (2006.01) | |
| H01L 21/027 | (2006.01) | |
| H01L 21/033 | (2006.01) | |
| G03F 7/00 | (2006.01) | |
| G03F 7/11 | (2006.01) | |

(52) U.S. Cl.
CPC ........ *H01L 21/3086* (2013.01); *G03F 7/0035* (2013.01); *G03F 7/11* (2013.01); *H01L 21/0274* (2013.01); *H01L 21/0337* (2013.01); *H01L 21/0338* (2013.01)

(58) Field of Classification Search
None
See application file for complete search history.

(56) References Cited

U.S. PATENT DOCUMENTS

| | | |
|---|---|---|
| 9,122,147 B2 | 9/2015 | Hatakeyama et al. |
| 9,291,909 B2 | 3/2016 | Wu et al. |
| 9,366,963 B2 | 6/2016 | Hatakeyama et al. |
| 9,406,526 B2 | 8/2016 | Devilliers |
| 9,671,697 B2 | 6/2017 | Zhou et al. |
| 2013/0260313 A1* | 10/2013 | Allen .................... G03F 7/0397 430/284.1 |

(Continued)

OTHER PUBLICATIONS

International Search Report and Written Opinion of the International Searching Authority dated Aug. 25, 2021 in PCT/US2021/030927, 8 pages.

*Primary Examiner* — Jiong-Ping Lu
(74) *Attorney, Agent, or Firm* — Oblon, McClelland, Maier & Neustadt, L.L.P.

(57) ABSTRACT

In method of patterning a substrate, a first relief pattern is formed based on a first layer deposited over a substrate. Openings in the first relief pattern are filled with a reversal material. The first relief pattern is then removed from the substrate and the reversal material remains on the substrate to define a second relief pattern. A fill material is deposited over the substrate that is in contact with the second relief pattern, and sensitive to a photo-acid generated from a photo-acid generator in the second relief pattern. Selected portions of the second relief pattern are exposed to a first actinic radiation to generate the photo-acid in the selected portions of the second relief pattern. The photo-acid are driven from the selected portions of the second relief pattern into portions of the fill material so that the portions of the fill material to become soluble to a predetermined developer.

20 Claims, 5 Drawing Sheets

(56) References Cited

U.S. PATENT DOCUMENTS

| | | | |
|---|---|---|---|
| 2014/0225252 A1* | 8/2014 | Lin | .................. H01L 21/76816 |
| | | | 257/737 |
| 2014/0235057 A1 | 8/2014 | Hatakeyama et al. | |
| 2014/0342290 A1 | 11/2014 | Wu et al. | |
| 2015/0147697 A1 | 5/2015 | Hatakeyama et al. | |
| 2015/0294878 A1* | 10/2015 | deVilliers | ......... H01L 21/76816 |
| | | | 438/703 |
| 2016/0357110 A1 | 12/2016 | Zhou et al. | |
| 2016/0377982 A1* | 12/2016 | deVilliers | ............... G03F 7/405 |
| | | | 430/325 |

\* cited by examiner

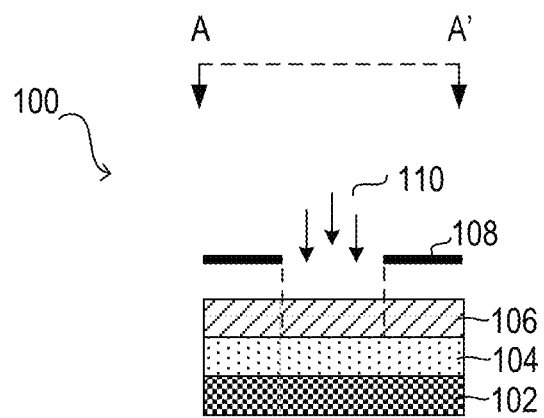
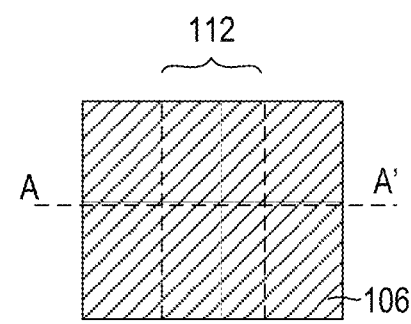
FIG. 1A  FIG. 1B
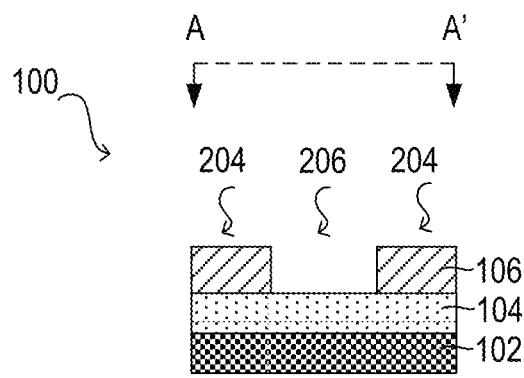
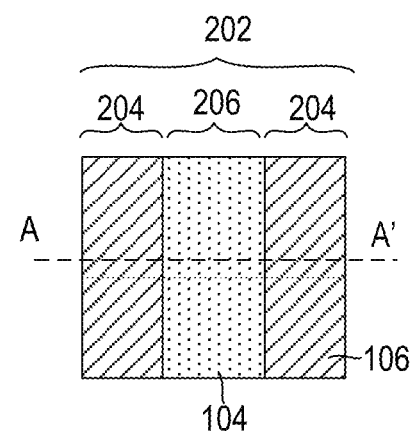
FIG. 2A  FIG. 2B

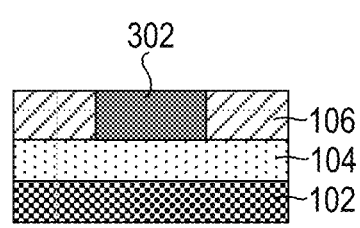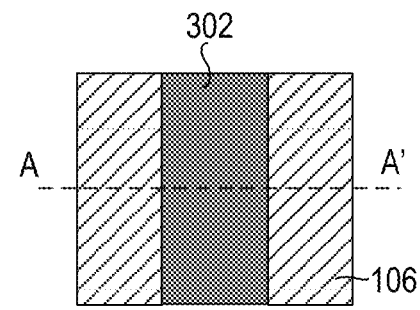
FIG. 3A  FIG. 3B
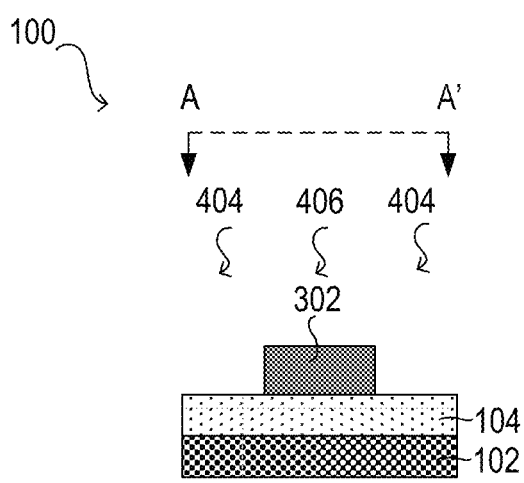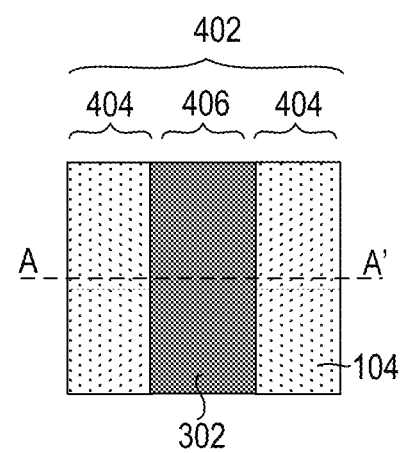
FIG. 4A  FIG. 4B

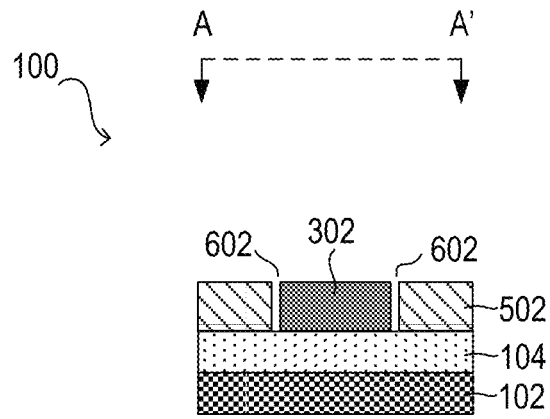
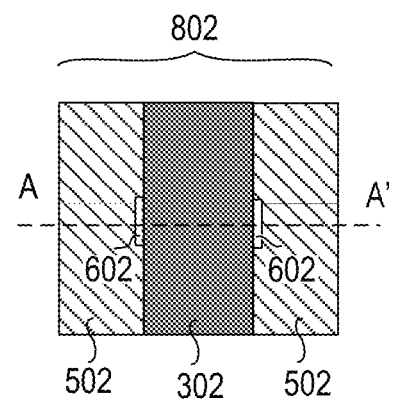
FIG. 7A
FIG. 7B
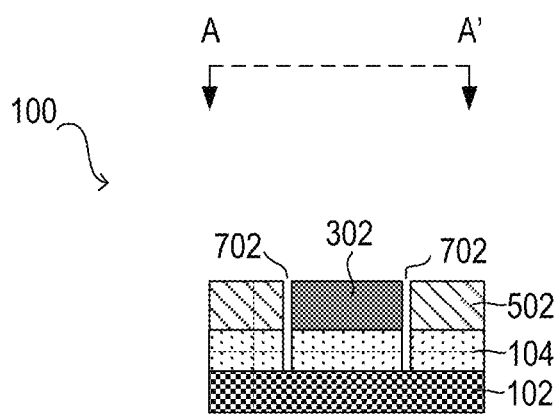
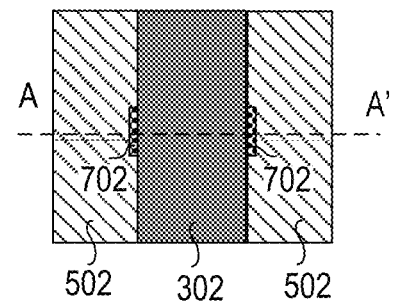
FIG. 8A
FIG. 8B

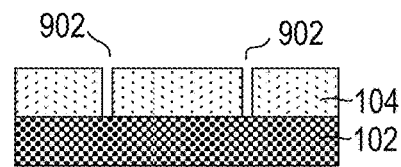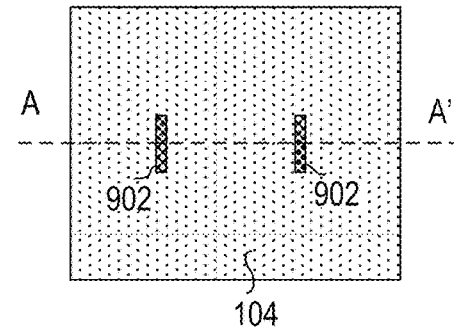
FIG. 9A
FIG. 9B

METHOD TO FORM NARROW SLOT CONTACTS

CROSS REFERENCE TO RELATED APPLICATIONS

This application claims the benefit of U.S. Provisional Application No. 63/037,798 filed on Jun. 11, 2020, the entire contents of which is incorporated herein by reference.

FIELD OF THE INVENTION

This invention relates to microfabrication including microfabrication of integrated circuits as well as processes involved in patterning semiconductor substrates.

BACKGROUND

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic exposure system. This exposure creates a latent pattern within the radiation-sensitive material which can then be developed. Developing refers to dissolving and removing a portion of the radiation-sensitive material to yield a relief pattern (topographic pattern). The portion of material removed can be either irradiated regions or non-irradiated regions of the radiation-sensitive material depending on a photoresist tone and/or type of developing solvent used. The relief pattern can then function as a mask layer defining a pattern.

Preparation and development of various films used for patterning can include thermal treatment or baking. For example, a newly applied film can receive a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrates typically include one or more baking modules. Some photolithography processes followed by coating with a resist, and then exposing the substrate to a pattern of light as include coating a substrate with a thin film of Bottom Anti-reflective Coating (BARC), followed by coating with a resist, and then exposing the substrate to a pattern of light as a process step for creating microchips. A relief pattern created can then be used as a mask or template for additional processing such as transferring the pattern into an underlying layer.

SUMMARY

Ever continuous scaling requires improved patterning resolution. One approach is spacer technology to define a sub-resolution line feature via ALD (atomic layer deposition). One challenge, however, is that if the opposite tone feature is desired, using spacer techniques can be complex involving over-coating another material, chemical mechanical planarization (CMP), and reactive ion etch (RIE) to exhume the spacer material leaving a narrow trench, which can be costly.

Anti-spacer is a self-aligned technology that uses the diffusion length of a reactive species to define a critical dimension (CD), creating a narrow trench. With a reactive species controlled spatially via exposure through a mask, then instead of a narrow trench, a narrow slot contact can be formed. A corresponding CD can be tuned through molecular weight modification of the reactive species, molecular structure of the reactive species, and the bake temperature and bake time. These techniques enable access to narrow slot contact features at dimensions beyond the reach of advanced lithographic capabilities. But processing requires a "freeze" step, that is, a treatment that neutralizes a solubility shifting potential of a layer having a photo-acid generator. Freeze processing, however, is not perfect and can reduce throughput. Techniques herein provide a "freeze-less" anti-spacer method that enables accessing narrow slot contacts defined by diffusion lengths. Techniques include inverting a pattern and using compositions resistive to solubility shifts.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method of patterning a substrate is provided. In the method, a first relief pattern that includes openings can be formed based on a first layer deposited over a substrate. The openings in the first relief pattern can be filled with a reversal material, where the reversal material can contain a resin and a photo-acid generator. The resin can be insoluble to a predetermined developer, and the resin can further be insensitive to a photo-acid generated from the photo-acid generator in that the resin remains insoluble to the predetermined developer when the resin is in contact with the photo-acid. The first relief pattern can then be removed from the substrate such that the reversal material remains on the substrate to define a second relief pattern, where the second relief pattern is an inverse pattern of the first relief pattern. A fill material can subsequently be deposited over the substrate. The fill material can be in contact with the second relief pattern, and sensitive to the photo-acid generated from the photo-acid generator in that portions of the fill material that are in contact with the photo-acid become soluble to the predetermined developer. Selected portions of the second relief pattern can be exposed to a first actinic radiation that causes a portion of the photo-acid generator within the selected portions of the second relief pattern to generate the photo-acid in the selected portions of the second relief pattern. The photo-acid generated in the selected portion of the second relief pattern can be further driven from the selected portions of the second relief pattern into portions of the fill material through interfaces between the selected portions of the second relief pattern and the fill material. Accordingly, the photo-acid can cause the portions of the fill material to become soluble to the predetermined developer.

In the method, the soluble portions of the fill material can be removed by using the predetermined developer so as to form a third relief pattern. The third relief pattern can uncover an underlying layer that is positioned between the substrate and the fill material.

In the method, the third relief pattern can further be transferred into the underlying layer through an etching process.

In some embodiments, in order to drive the photo-acid generated in the selected portion of the second relief pattern from the selected portions of the second relief pattern into the portions of the fill material, the photo-acid can be diffused a predetermined distance into the fill material by a diffusion process through the interfaces between the selected portions of the second relief pattern and the fill material.

In some embodiments, in order to form the first relief pattern, the first layer can be exposed to a second actinic radiation that forms a latent pattern, and the latent pattern can be developed through a developer to form the first relief pattern.

In some embodiments, the first layer can be a layer of photoresist.

In order to fill the openings in the first relief pattern, an overburden of the reversal material can be deposited and the overburden of the reversal material can further be removed.

In some embodiments, the fill material can be free of the photo-acid generator.

In the method, in order to drive the photo-acid generated in the selected portion of the second relief pattern from the selected portions of the second relief pattern into the fill material, a thermally activated diffusion process can be applied to drive the photo-acid.

In some embodiments, the thermally activated diffusion process can include heating the substrate at a predetermined temperature for a predetermined duration.

In some embodiments, the fill material can include a de-protection group that causes the fill material to become soluble in a presence of the photo-acid.

According to another aspect of the disclosure, a method of patterning a substrate is provided. In the method, a first relief pattern that includes openings can be formed based on a first layer deposited over a substrate. The openings in the first relief pattern can be filled with a reversal material, where the reversal material can contain a resin and a generator compound that generates a solubility-changing agent in response to exposure to an actinic radiation. The resin can be insoluble to a predetermined developer, and further be insensitive to the solubility-changing agent in that the resin remains insoluble to the predetermined developer when the resin is in contact with the solubility-changing agent. The first relief pattern can then be removed from the substrate such that the reversal material remains on the substrate to define a second relief pattern, where the second relief pattern can be an inverse pattern of the first relief pattern. A fill material can be deposited on the substrate, where the fill material can be in contact with the second relief pattern, and sensitive to the solubility-changing agent generated from the generator compound in that portions of the fill material that are in contact with the solubility changing agent become soluble to the predetermined developer. Selected portions of the second relief pattern can be exposed to an actinic radiation that causes a portion of the generator compound within the selected portions of the second relief pattern to generate the solubility-changing agent in the selected portion of the second relief pattern. The solubility-changing agent generated in the selected portions of the second relief pattern to can be driven to diffuse from the selected portions of the second relief pattern into portions of the fill material through interfaces between the selected portions of the second relief pattern and the fill material. The solubility-changing agent can cause the portions of the fill material to become soluble to the predetermined developer.

In an embodiment, the solubility-changing agent can include a photo-acid.

In another embodiment, the solubility-changing agent can include a photo destructive base.

In some embodiments, the generator compound can be a photo acid generator (PAG) that generates the photo-acid in response to exposure to the first actinic radiation.

In some embodiments, the generator compound can be a photo destructive base generator that generates the photo destructive base in response to exposure to the first actinic radiation.

In some embodiments, in order to drive the solubility-changing agent generated in the selected portions of the second relief pattern to diffuse from the selected portions of the second relief pattern into the portions of the fill material, a thermally activated diffusion process can be applied by controlling an average diffusion length of the solubility-changing agent.

In some embodiments, the generator compound includes a thermal acid generator (TAG), where the thermal acid generator can include sulfonate esters that are derived from oximes, imides and benzyl alcohols.

In some embodiments, the fill material can be free of the generator compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4A, 4B, 5A, 5B, 6A, 6B, 7A, 7B, 8A, 8B, 9A, and 9B are cross-sectional and top down views of intermediate steps of manufacturing narrow slot contacts, in accordance with some embodiments.

DETAILED DESCRIPTION

Figure 5A:
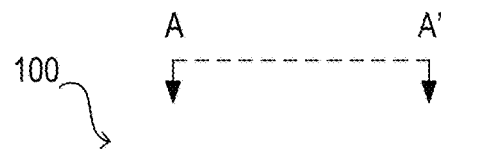
Figure 5A:
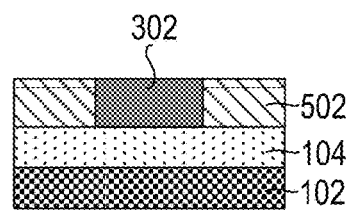

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein provide a "freeze-less" anti-spacer method that enables accessing narrow slot contacts defined by diffusion lengths. Techniques include inverting a pattern and using compositions resistive to solubility shifts. Description of example embodiments herein can use a photo-acid as reactive species. However, other solubility-shifting agents can also be used, such as a photo-destructive base.

In the disclosure, methods of patterning a substrate, especially, methods of patterning a substrate to form narrow slot contacts are provided. FIGS. 1A, 2A, 3A, 4A, 5A, 6A, 7A, 8A, and 9A are cross-sectional views of intermediate steps of manufacturing narrow slot contacts. FIGS. 1B, 2B, 3B, 4B, 5B, 6B, 7B, 8B, and 9B are top down views of the intermediate steps of manufacturing the narrow slot contacts. The cross-sectional views are obtained from a plane same as a vertical plane containing line A-A' in the top down views.

FIG. 1A shows cross-sectional view and FIG. 1B shows a top down view of an example substrate segment 100 being exposed to an actinic radiation 110 through a photomask 108 to create a latent pattern 112 in a first layer 106. In some embodiments, the first layer 106 can be formed of a photoresist material or other photo-sensitive materials. As shown in FIG. 1A, the substrate segment 100 can include a substrate 102, a dielectric layer (or underlying layer) 104 over the substrate 102, and the first layer 106 positioned over the dielectric layer 104. The substrate 102 can be a semiconductor substrate such as Si substrate. The substrate 102 may also include other semiconductors such as germanium (Ge), silicon carbide (SiC), silicon germanium (SiGe), or diamond. Alternately, the substrate 102 may include a compound semiconductor and/or an alloy semiconductor. The dielectric layer 104 can include SiO, SiN, SiCN, SiON, or other suitable dielectric materials. In some embodiments, the dielectric layer 104 can be a dielectric stack that includes one or more dielectric layers. In some embodiments, the first layer 106 that is a photoresist may be composed of a non-chemically amplified system such as a diazonaphtho-quinone dissolution inhibitor and a Novolak polymer.

Still referring to FIGS. 1A and 1B, in an embodiment, exposed portions (e.g. the latent pattern 112) of the first layer 106 can become soluble to a particular developer. In another embodiment, the actinic radiation 110 can cause the exposed portions of the first layer 106 to become insoluble depending on a material type (or a tone) of the first layer 106, and a material type (or a tone) of the corresponding developer.

FIGS. 2A and 2B illustrate a result after a develop step is executed. In the develop step, developing chemicals in the particular developer can be applied to dissolve the exposed regions (e.g., the latent pattern 112) of the first layer 106 so that the exposed regions can be washed away from the substrate segment 100. Accordingly, a first relief pattern or topographical pattern 202 can be formed over the substrate 102. The first relief pattern 202 can include raised features 204 covering the underlying layer 104, and openings 206 uncovering other portions of the underlying layer 104. The first relief pattern 202 can be formed by a photolithography process or other means as mentioned above. In an exemplary embodiment of FIGS. 2A and 2B, the openings 206 of the first relief pattern 202 in the illustrated substrate segment 100 can have a trench profile. In another embodiment, the openings 206 can be trenches, slots, holes, or any shape according to the structures of the contacts.

In FIGS. 3A and 3B, a reversal material 302 can be filled in the openings 206 of the first relief pattern 202. The reversal material 302 can contain a resin and a generator compound, such as a photo-acid generator. The resin can be selected to be insensitive (with respect to solubility) to a photo-acid generated by the photo-acid generator and insoluble to one or more particular developers. Thus, the reversal material 302 can be free from functional groups that would cause a solubility shift from the photo-acid, or include functional groups to prevent a solubility-shift, depending on tone scheme. In some embodiments, the resin can be a co- or ter-polymer composed of monomers including but not limited to styryl groups, low molecular weight acrylates such as methacrylic acid, methyl methacrylate and tert-butyl acrylate, lactones, norbornene and adamantyl derivates. Primary design rules for choice of monomer composition and ratio are casting solvent solubility, developer solubility and etch resistance.

In an embodiment, the generator compound in the reversal material 302 can include a photo acid generator (PAG) that generates a photo-acid in response to exposure to an actinic radiation. In another embodiment, the generator compound can include a photo destructive base generator that generates the photo destructive base in response to exposure to the actinic radiation. In some embodiments, the acid source (e.g., the generator compound) in the reversal material 302 can be a thermal acid generator (TAG).

Typical PAG compositions include iodonium or sulfonium salts with a counterion such as a fluorinated sulfonate or hexafluoroantimonate. The structure of the PAG can define a wavelength of an irradiation (e.g., actinic radiation 110) necessary for activation. Acid generation from the reversal material 302 can occur by irradiation from a wide array of wavelengths but can be optimally chosen to coincide with the absorption of the resin in the reversal material 302. Common TAGs include, but are not limited to, various sulfonate esters that are derived from oximes, imides and benzyl alcohols.

Deposition of such reversal materials 302 can typically result in an overburden of the reversal material over the first layer 106, especially when the reversal material 302 is deposited by a spin-on deposition. The overburden can be removed via any planarization process, such as a chemical mechanical planarization (CMP), a controlled wet etch-back (by using TMAH, for example), and a chemically-amplified planarization using a location-specific top-down acid diffusion in a developer scheme that can cause a shift (i.e., diffusion of the acid, the acid cause the material property changed, and soluble) to being soluble in a planarizing developer scheme. Alternatively, selective deposition techniques can be used that deposit the reversal material 302 in the openings 206 without depositing on the raised features 204 of the first relief pattern 202. FIGS. 3A and 3B illustrate an example result after the overburden of the reversal material 302 is removed.

Next, the first relief pattern 202 can be removed from the substrate segment 100. As shown in FIGS. 4A and 4B, the raised features 204 that are formed of the first layer 106 in the first relief pattern 202 are removed, and the reversal material 302 still remains. In order to remove the first relief pattern 202 without attacking the reversal material 302, a wet etch back process can be applied. The wet etch back process can apply a solvent system in which the reversal material 302 is weakly soluble relative to the first relief pattern 202. An exemplary solvent system can include either a dilute aqueous developer or a solution composed of casting solvent. When the first relief pattern 202 is removed, the reversal material 302 accordingly forms a second relief pattern 402 that is essentially an inverse of the first relief pattern 202. As shown in FIGS. 4A and 4B, the second relief pattern 402 can have a raised feature 406 that is formed of the reversal material 302, and openings 404 that uncover the underlying layer 104.

Figure 5B:
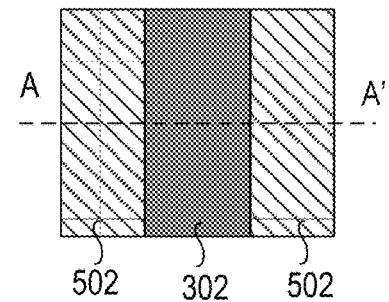

A fill material 502 can then be deposited on the substrate segment 100 (and on the second relief pattern 402) to fill the openings 404 defined by the second relief pattern 402. The fill material 502 can be selected as, or comprised of, a material that is sensitive to the photo-acid that can be generated within the reversal material 302. Thus, the fill material 502 can be an acid-sensitive overcoat. The fill material 502, when is in contact with the photo-acid that generated by the photo-acid generator in the reversal material 302, becomes soluble to a particular developer. Any overburden of the fill material 502 can be subsequently removed using planarization techniques, which are described above to remove the overburden of the reversal material 302. FIGS. 5A and 5B show an exemplary embodiment of the deposition of the fill material 502. The fill material 502 can be a co- or ter-polymer similar in design to the reversal material 302 in that the primary design requirements are casting solvent solubility, developer solubility and etch resistance to maximize the contrast between the fill material 502 and the reversal material 302. A list of common monomers include styryl groups, low molecular weight acrylates and lactones similar to the reversal material 302, however the ratio of the monomers can vary significantly.

Figure 6A:
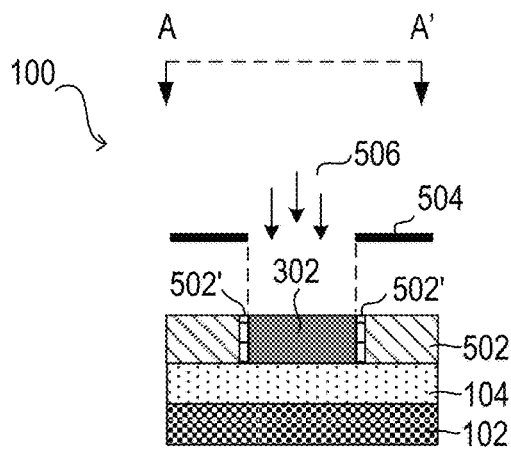
Figure 6B:
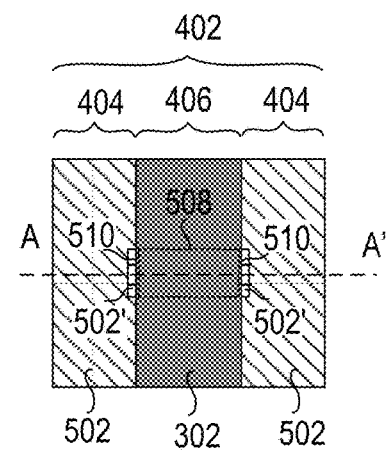

FIGS. 6A and 6B show an exposure of the second relief pattern to a pattern of a second actinic radiation 506. The pattern of the second actinic radiation 506 can expose selected portions (or all of) of the raised feature (e.g., 406) in the second relief pattern 402 based on a mask 504. In an exemplary embodiment of FIGS. 6A and 6B, a selected portion 508 of the raised feature 406 in the second relief pattern 402 can be exposed by the second actinic radiation 506, where the raised feature 406 is formed of the reversal material 302. Thus, an acid (or photo-acid) can be generated by the photo-acid generator according to the second actinic radiation 506 within the selected portions (e.g., 508) of the raised feature 406 in the second relief pattern 402. After the acid (or photo-acid) is generated, the photo-acid can be diffused into surrounding materials, which can be the fill material 502, for example. The acid diffusion from the second relief pattern 402 to the fill material 502 can be precisely controlled. For example, a length or a distance of the acid diffusion can be controlled by a type of the acid, and/or by a time and a temperature of a thermally activated diffusion process (e.g., a diffusion bake) that drive the photo-acid to diffuse from the second relief pattern 402 to the fill material 502. In an exemplary embodiment of FIG. 6B, the selected portion 508 can be a rectangular section of the raised feature 406 in the second relief pattern 402. Thus, the acid can be generated by the photo-acid generator in such a rectangular section. The acid can further diffuse into the fill material 502 through interfaces 510 between the selected portion 508 of the second relief pattern 402 and the fill material 502 by applying the thermally activated diffusion process. When the thermally activated diffusion process is completed, the acid can be disposed in slot-shaped regions 502' of the fill material 502. The photo-acid can cause the slot-shaped regions 502' of the fill material 502 to be soluble to a developer. FIG. 6B illustrate the narrow and slot-shaped regions 502' that are formed in the fill material 502, and formed by driving the photo-acid generated in the selected portions (e.g., 508) of the second relief pattern 402 into the fill material 502.

In FIGS. 7A and 7B, the substrate segment 100 can then be developed with a particular developer to remove the slot-shaped regions 502' of the fill material 502. Example developers can include an aqueous solution of 0.26N tetramethyl ammonium hydroxide (TMAH), dilutions of aqueous TMAH such as 0.13N or aqueous TMAH with the addition of various surfactants. The particular developer can dissolve the slot-shaped regions 502' of the fill material 502, and slot-shaped openings 602 can subsequently be formed in the fill material 502 adjacent to the reversal material 302. As shown in FIGS. 7A and 7B, portions of the underlying layer 104 can be uncovered by the slot-shaped openings 602. The slot-shaped openings 602 can have a critical dimension (or width) defined by an acid diffusion length of the photo-acid that diffuses from the selected portions (e.g., 508) of the second relief pattern into the fill material 502. The acid diffusion length can be controlled to single-digit nanometer dimensions. It should be noted that the particular developer impacts the reversal material 302 very less. Thus, the reversal material 302 is unaffected when the substrate segment 100 is developed with the particular developer.

Still referring to FIGS. 7A and 7B, when the slot-shaped openings 602 are formed in the fill material 502, a third relief pattern 802 can subsequently be formed to include the slot-shaped openings 602 and raised features that are formed of the reversal material 302 and the fill material 502. In FIGS. 8A and 8B, the third relief pattern 802 can be transferred into the underlying layer 104 through an etching process to form openings 702. In an exemplary embodiment of FIGS. 7A and 7B, the openings 702 can be slot-shaped openings 702. The slot-shaped openings 702 can extend through the fill material 502 and the underlying layer 104 so that the substrate 102 can be uncovered. The etching process can be a wet etching or a dry etching (e.g., an anisotropic plasma etching). During the etching process, the fill material 502, the slot-shaped openings 602 positioned in the fill material 502, and the reversal material 302 can function as a combined etch mask for transferring the slot-shaped pattern defined by the slot-shaped openings 602 into the underlying layer 104.

It should be noted that FIGS. 7A and 7B are merely an exemplary embodiment of the third relief pattern 802. The third relief pattern 802 can include hole-shaped openings, line-shaped openings, or openings with other shapes. Thus, the third relief pattern 802 can be transferred into the underlying layer 104 to form holes, trenches, or openings with corresponding shapes accordingly in FIGS. 8A and 8B.

In FIGS. 9A and 9B, the reversal material 302 and the fill material 502 can be removed by a plasma process, such as an O2 ashing process. During the plasma process, a portion of the opening 702 in the fill material 502 can be removed, and a portion of the opening 702 in the underlying layer 104 can still remain. The portion of the opening 702 that remains in the underlying layer 104 can become openings 902. As mentioned above, the openings 902 can have a slot shape, a hole shape, a trench shape, or other shapes according to the third relief pattern 802. The openings 902 can further be filled with conductive materials to form narrow slot contacts that can connect active regions (e.g., a source region, a drain region, or a doped region) in the substrate 102 and other components (e.g., a transistor, a metal line, or a capacitor) above the substrate 102.

The methods mentioned above illustrate an anti-spacer patterning process for making narrow slot contacts without a solubility neutralizing treatment. The anti-spacer patterning process in the present disclosure provides a "freeze-less" anti-spacer patterning method that enables accessing narrow slot contacts defined by diffusion lengths by inverting a pattern and using compositions resistive to solubility shifts. The anti-spacer patterning process herein enables access to pattern resolutions well below the theoretical limit of 365 and 248 nm lithography used in 200 mm sites. CDs defined by an acid diffusion from the reversal material allow for precise control to achieve pattern resolutions on the order of 40-100 nm. Aspect ratios below 10:1 can especially benefit to improve etch performance and mitigate pattern collapse. Conventional i-line resists can be coated below 400 nm in thickness. Additional processing allows for thinner coatings thereby providing a wider process window to further reduce the trench CD. Novolak photoresists are a mature technology capable of achieving high sidewall angles that help maximize aspect ratios to form sub-resolution trenches.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of patterning a substrate, the method comprising:
    forming a first relief pattern including openings based on a first layer deposited over a substrate;
    filling the openings in the first relief pattern with a reversal material, the reversal material as deposited to fill the openings containing a resin and a photo-acid generator, the resin being insoluble to a predetermined developer without any post-deposit solubility-neutralizing treatment, and the resin being further insensitive to a photo-acid generated from the photo-acid generator in that the resin remains insoluble to the predetermined developer when the resin is in contact with the photo-acid without any post-deposit solubility-neutralizing treatment;
    removing the first relief pattern from the substrate such that the reversal material remains on the substrate to define a second relief pattern, the second relief pattern being an inverse pattern of the first relief pattern;
    depositing a fill material over the substrate, the fill material being in contact with the second relief pattern, and sensitive to the photo-acid generated from the photo-acid generator in that portions of the fill material that are in contact with the photo-acid become soluble to the predetermined developer;
    exposing selected portions of the second relief pattern to a first actinic radiation that causes a portion of the photo-acid generator within the selected portions of the second relief pattern to generate the photo-acid in the selected portions of the second relief pattern; and
    driving the photo-acid generated in the selected portion of the second relief pattern from the selected portions of the second relief pattern into portions of the fill material through interfaces between the selected portions of the second relief pattern and the fill material, the photo-acid causing the portions of the fill material to become soluble to the predetermined developer.

2. The method of claim 1, further comprising removing the portions of the fill material by using the predetermined developer so as to form a third relief pattern uncovering an underlying layer that is positioned between the substrate and the fill material.

3. The method of claim 2, further comprising:
    transferring the third relief pattern into the underlying layer through an etching process.

4. The method of claim 1, wherein the driving the photo-acid generated in the selected portions of the second relief pattern from the selected portions of the second relief pattern into the portions of the fill material includes diffusing the photo-acid a predetermined distance into the fill material by a diffusion process through the interfaces between the selected portions of the second relief pattern and the fill material.

5. The method of claim 1, wherein the forming the first relief pattern includes exposing the first layer to a second actinic radiation that forms a latent pattern, and developing the latent pattern through a developer to form the first relief pattern.

6. The method of claim 1, wherein the first layer is a layer of photoresist.

7. The method of claim 1, wherein the filling the openings in the first relief pattern includes depositing an overburden of the reversal material and removing the overburden of the reversal material.

8. The method of claim 1, wherein the fill material is free of the photo-acid generator.

9. The method of claim 1, wherein the driving the photo-acid generated in the selected portions of the second relief pattern from the selected portions of the second relief pattern into the fill material includes applying a thermally activated diffusion process to drive the photo-acid.

10. The method of claim 9, wherein the thermally activated diffusion process includes heating the substrate at a predetermined temperature and for a predetermined duration.

11. The method of claim 1, wherein the fill material includes a de-protection group that causes the fill material to become soluble in a presence of the photo-acid.

12. A method of patterning a substrate, the method comprising:
forming a first relief pattern that including openings based on a first layer deposited over a substrate;
filling the openings in the first relief pattern with a reversal material, the reversal material as deposited to fill the openings containing a resin and a generator compound that generates a solubility-changing agent in response to exposure to an actinic radiation, the resin being insoluble to a predetermined developer without any post-deposit solubility-neutralizing treatment, and the resin being further insensitive to the solubility-changing agent in that the resin remains insoluble to the predetermined developer when the resin is in contact with the solubility-changing agent without any post-deposit solubility-neutralizing treatment;
removing the first relief pattern from the substrate such that the reversal material remains on the substrate to define a second relief pattern, the second relief pattern being an inverse pattern of the first relief pattern;
depositing a fill material on the substrate, the fill material being in contact with the second relief pattern, and sensitive to the solubility-changing agent generated from the generator compound in that portions of the fill material that are in contact with the solubility-changing agent become soluble to the predetermined developer;
exposing selected portions of the second relief pattern to an actinic radiation that causes a portion of the generator compound within the selected portions of the second relief pattern to generate the solubility-changing agent in the selected portion of the second relief pattern; and
driving the solubility-changing agent generated in the selected portions of the second relief pattern to diffuse from the selected portions of the second relief pattern into portions of the fill material through interfaces between the selected portions of the second relief pattern and the fill material, the solubility-changing agent causing the portions of the fill material to become soluble to the predetermined developer.

13. The method of claim 12, wherein the solubility-changing agent includes a photo-acid.

14. The method of claim 13, wherein the generator compound is a photo acid generator (PAG) that generates the photo-acid in response to exposure to the actinic radiation.

15. The method of claim 12, wherein the solubility-changing agent includes a photo destructive base.

16. The method of claim 15, wherein the generator compound is a photo destructive base generator that generates the photo destructive base in response to exposure to the actinic radiation.

17. The method of claim 12, wherein the driving the solubility-changing agent generated in the selected portions of the second relief pattern to diffuse from the selected portions of the second relief pattern into the portions of the fill material includes applying a thermally activated diffusion process by controlling an average diffusion length of the solubility-changing agent.

18. He method of claim 12, wherein the generator compound includes a thermal acid generator (TAG).

19. The method of claim 18, wherein the thermal acid generator comprises sulfonate esters that are derived from oximes, imides and benzyl alcohols.

20. The method of claim 12, wherein the fill material is free of the generator compound.

* * * * *

UNITED STATES PATENT AND TRADEMARK OFFICE
CERTIFICATE OF CORRECTION

| | | |
|---|---|---|
| PATENT NO. | : 11,682,559 B2 | Page 1 of 1 |
| APPLICATION NO. | : 17/221416 | |
| DATED | : June 20, 2023 | |
| INVENTOR(S) | : Murphy et al. | |

It is certified that error appears in the above-identified patent and that said Letters Patent is hereby corrected as shown below:

In the Claims

In Column 12, Claim 18, Line 38, delete "He" and insert -- The --, therefor.

Signed and Sealed this
Twenty-eighth Day of November, 2023

Katherine Kelly Vidal
*Director of the United States Patent and Trademark Office*